US012219718B2

(12) United States Patent
Nemoto (10) Patent No.: US 12,219,718 B2
(45) Date of Patent: Feb. 4, 2025

(54) IMAGING APPARATUS HAVING A ROTATION DRIVE UNIT CONNECTED TO A FIXED UNIT THROUGH WIRING

(71) Applicant: CANON KABUSHIKI KAISHA, Tokyo (JP)

(72) Inventor: Ayumu Nemoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/484,692

(22) Filed: Sep. 24, 2021

(65) Prior Publication Data

US 2022/0104366 A1 Mar. 31, 2022

(30) Foreign Application Priority Data

Sep. 25, 2020 (JP) .................................. 2020-161439

(51) Int. Cl.
  *H05K 5/00* (2006.01)
  *H01R 35/02* (2006.01)
  *H04N 23/51* (2023.01)

(52) U.S. Cl.
  CPC ......... *H05K 5/0047* (2013.01); *H01R 35/025* (2013.01); *H04N 23/51* (2023.01)

(58) Field of Classification Search
  CPC .. H05K 5/0047; H01R 35/025; H04N 5/2252; H04N 5/23258; H04N 5/23299; H04N 5/2257; H04M 1/026; H04M 1/0264
  See application file for complete search history.

(56) References Cited

U.S. PATENT DOCUMENTS

| 7,170,560 | B2 * | 1/2007 | Tatewaki | ........... G08B 13/1963 |
| | | | | 348/375 |
| 8,628,257 | B2 * | 1/2014 | Iinuma | .................. G03B 17/563 |
| | | | | 396/420 |
| 8,891,005 | B2 * | 11/2014 | Sasaki | ..................... G03B 17/12 |
| | | | | 348/375 |
| 10,184,606 | B2 * | 1/2019 | Nokuo | .................. G03B 17/561 |
| 2018/0348595 | A1 * | 12/2018 | Obana | .................. H04N 23/695 |
| 2019/0331986 | A1 * | 10/2019 | Sasaki | ..................... G03B 17/12 |

FOREIGN PATENT DOCUMENTS

| EP | 3561591 A1 * | 10/2019 | ............. G03B 17/02 |
| JP | H08178182 A | 7/1996 | |
| JP | 2002369038 A | 12/2002 | |
| JP | 2004294622 A | 10/2004 | |
| JP | 2009288642 A | 12/2009 | |
| JP | 2014212392 A | 11/2014 | |
| JP | 2018205492 A | 12/2018 | |

* cited by examiner

*Primary Examiner* — James Wu
(74) *Attorney, Agent, or Firm* — Canon U.S.A., Inc. IP Division

(57) ABSTRACT

An electronic apparatus includes a movable cylinder, a support cylinder configured to support the movable cylinder rotatably around a panning rotation axis, a flexible wire connecting to a panning control circuit board in the support cylinder, and a storage area communicating with the movable cylinder and the support cylinder and containing the flexible wire. The flexile wire includes a first fixed part on the movable cylinder and a second fixed part on the support cylinder. In the storage area, the first fixed part is fixed to a first fixing part of the movable cylinder. In the storage area, the second fixed part is fixed to a second fixing part of the support cylinder.

8 Claims, 7 Drawing Sheets

IMAGING APPARATUS HAVING A ROTATION DRIVE UNIT CONNECTED TO A FIXED UNIT THROUGH WIRING

BACKGROUND OF THE INVENTION

Field of the Invention

The present invention relates to an electronic apparatus having a rotation drive device, more specifically to an electronic apparatus having a rotation drive unit connected to a fixed unit through wiring.

Description of the Related Art

Recent multi-purpose cameras connected to smartphones, personal computers, tablet terminals, or other devices through wireless communication are in widespread use, and such a camera enables the user at a location remote from the camera to view images from the camera.

This type of camera combined with technologies such as image recognition and artificial intelligence has been used in various services.

The various services cover a wide variety of fields, including field work assistance in monitoring the progress of work and the health conditions of workers at construction sites and services to use such cameras installed in elderly facilities to prevent residents from forgetting to take regular medicine or from mistakenly taking medicines.

A housing configuration applicable to such multi-purpose cameras is a camera apparatus with an imaging direction set by a horizontal rotation and a vertical rotation, as an example (Japanese Patent Application Laid-Open No. 2002-369038).

According to Japanese Patent Application Laid-Open No. 2002-369038, the camera apparatus includes an imaging device and a vertical rotation mechanism in the horizontal rotation unit, and further includes a horizontal rotation mechanism, a horizontal rotation drive mechanism, a vertical rotation drive mechanism, and other mechanisms in the fixed unit.

Imaging signals from the imaging device in the rotation unit are sent to the fixed unit and processed by a control circuit board.

A flexible cable as discussed in Japanese Patent Application Laid-Open No. 8-178182 and Japanese Patent Application Laid-Open No. 2014-212392 is employed to send them and configured to follow the motion of the movable part relative to the fixed unit.

However, according to Japanese Patent Application Laid-Open No. 8-178182, the cable is slack without being restrained in the apparatus.

Such a configuration allows stress on the cable due to following the movable part to be reduced. On the other hand, the cable would be more slackened to reduce the stress on cable connection parts, which is not suitable for downsizing the apparatus.

In addition, the cable according to Japanese Patent Application Laid-Open No. 2014-212392 is radially slackened, which causes a larger projected area.

Such a multi-purpose camera is not really user-friendly due to lack of considerations of decreasing the projected installation area of the imaging apparatus for the imaging apparatus to be installed anywhere and of achieving a smaller size and lower profile of the housing.

Thus, the present invention is directed to providing a compact rotation drive device with a wiring configuration reducing the stress on a wire and the wire connections.

SUMMARY OF THE INVENTION

According to an aspect of the present invention, an electronic apparatus includes a movable cylinder, a support cylinder configured to support the movable cylinder rotatably around a panning rotation axis, a flexible wire connecting to a panning control circuit board in the support cylinder, and a storage area communicating with the movable cylinder and the support cylinder and containing the flexible wire. The flexile wire includes a first fixed part on the movable cylinder and a second fixed part on the support cylinder. In the storage area, the first fixed part is fixed to a first fixing part of the movable cylinder. In the storage area, the second fixed part is fixed to a second fixing part of the support cylinder.

Further features of the present invention will become apparent from the following description of exemplary embodiments with reference to the attached drawings.

DESCRIPTION OF THE EMBODIMENTS

Hereinafter, an imaging apparatus 100 as an electronic apparatus in an exemplary embodiment of the present invention will be described with reference to the accompanying drawings. Like numbers refer to like members through the drawings.

A support cylinder 1 (fixed part) and a movable cylinder 2 (movable part) in the present invention are not limited to cylindrical shapes but may be rectangular (for example, cuboid).

Figure 1:
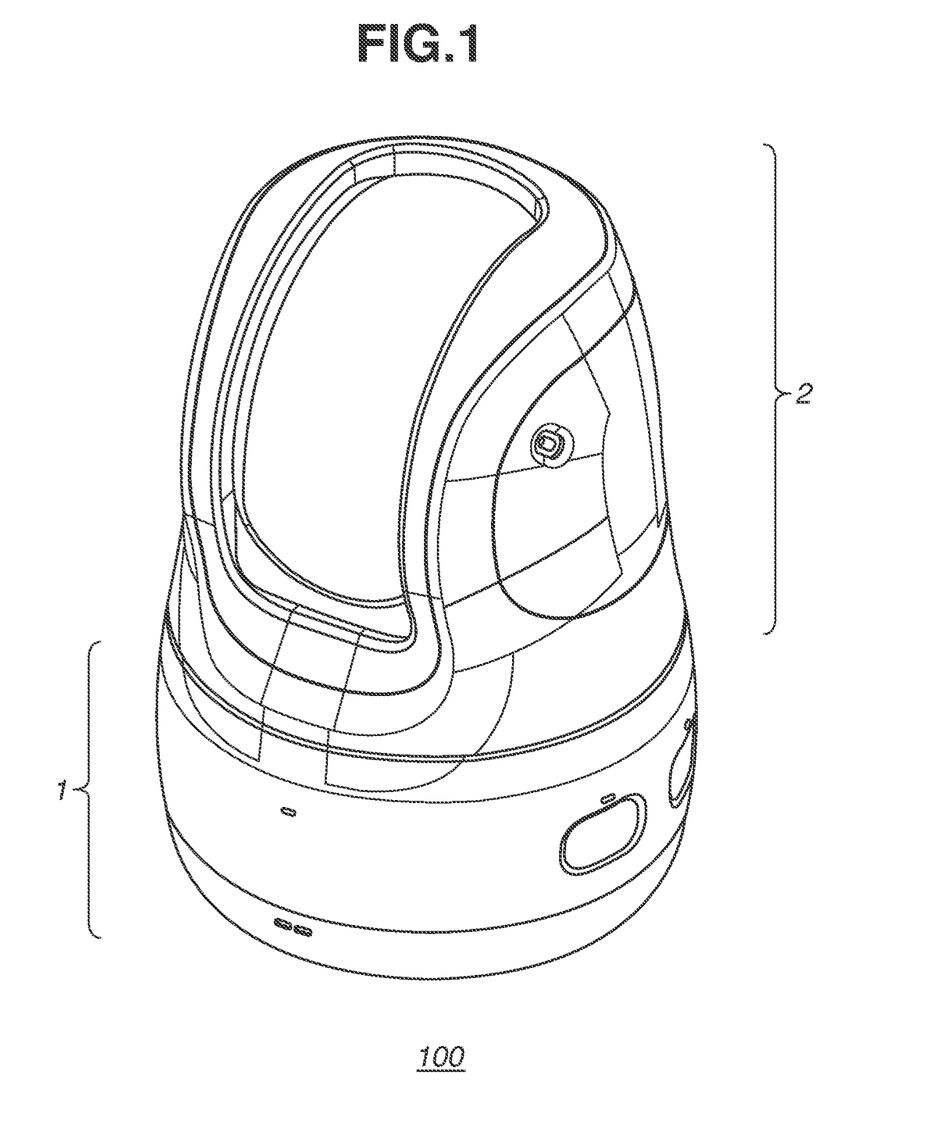
FIG. 1 is a perspective view of an imaging apparatus in an exemplary embodiment of the present invention.
Figure 2A:
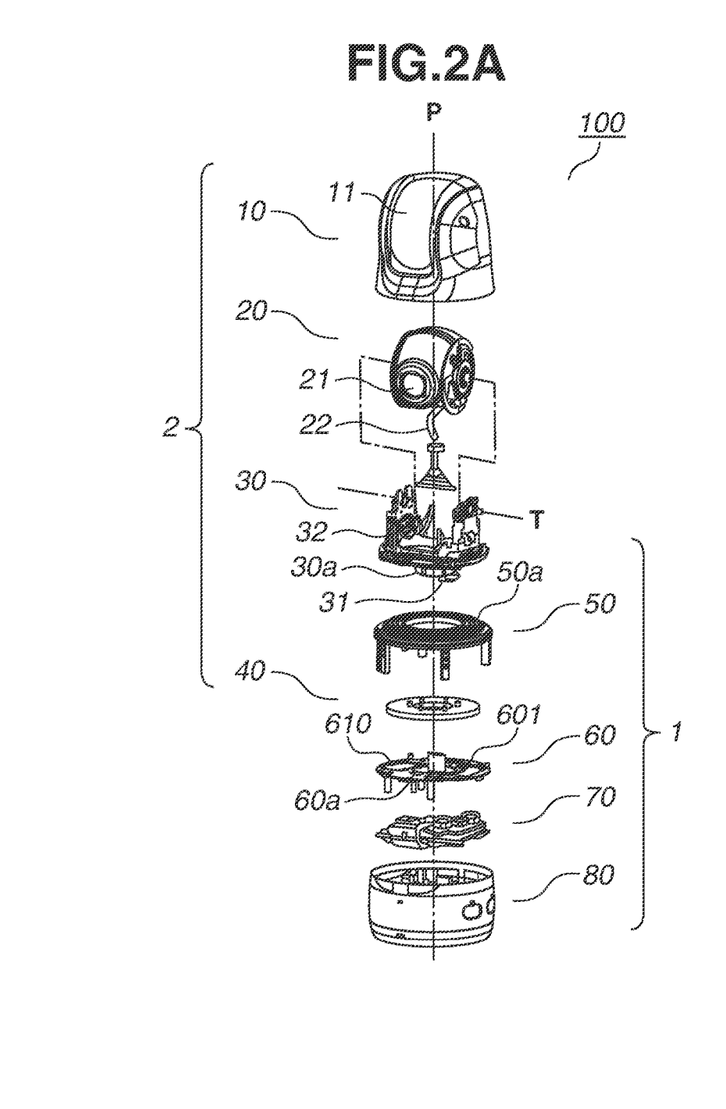
FIGS. 2A and 2B are exploded perspective views of the imaging apparatus in the exemplary embodiment of the present invention.
Figure 2B:
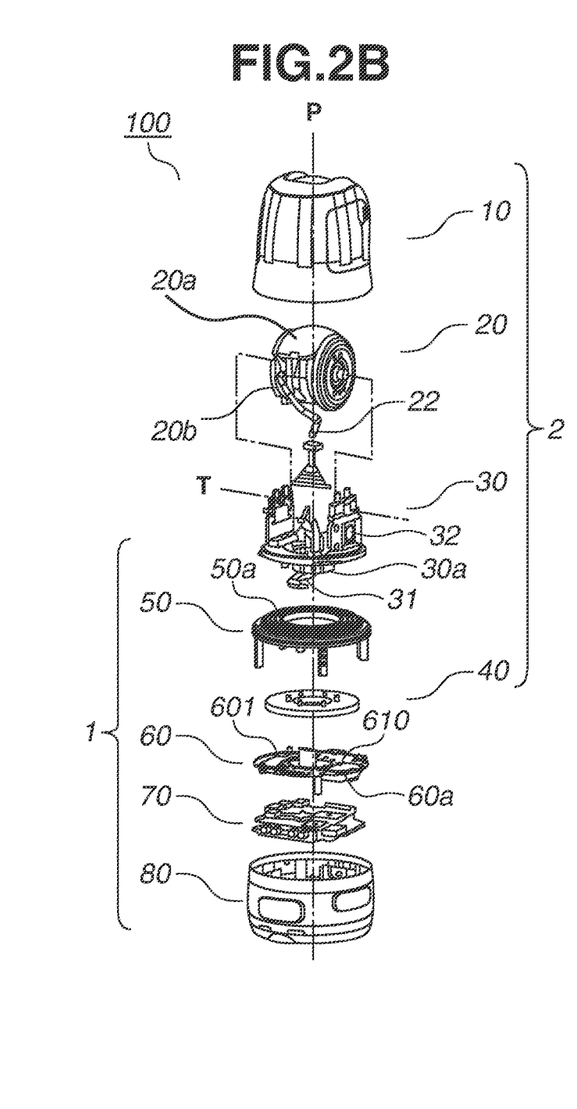

FIG. 1 is a perspective view of the imaging apparatus 100 as an electronic apparatus in the exemplary embodiment of the present invention. FIGS. 2A and 2B are exploded perspective views of the imaging apparatus 100 in the exemplary embodiment of the present invention.

(Perspective View of the Imaging Apparatus 100)

The imaging apparatus 100 mainly includes the movable part 2 and the fixed part 1. The movable part 2 mainly includes a top cover 10, a tilt unit 20, a pan unit base 30, and a pan unit rotation plate 40.

The fixed part 1 mainly includes a base cover 50, a chassis unit 60, a circuit board assembly 70, and a bottom unit 80.

The movable part 2 is held on top of the fixed part 1 horizontally rotatably (panning) around a rotation axis P with respect to the fixed part 1.

The top cover 10 includes a transparent dome 11 molded of a transparent resin material such as an acrylic resin.

The pan unit base 30 is inside the top cover 10, and holds the top cover 10 with plural screws.

The tilt unit 20 (a driven body) is inside the top cover 10 and held vertically rotatably (tilting) around a rotation axis T with respect to the pan unit base 30.

The rotation axis P and the rotation axis T are orthogonal to each other, but in one or more embodiments they are not orthogonal to each other.

A lens barrel unit 21 with an imaging optical system is in the tilt unit 20.

The lens barrel unit 21 includes an imaging device, not illustrated therein.

The imaging device includes a photoelectric conversion device such as a charge coupled device (CCD) sensor or a complementary metal oxide semiconductor (complementary MOS) sensor, and a low-pass filter.

The low-pass filter blocks infrared light from entering the unit to prevent occurrence of color moire patterns.

The imaging device is mounted on a printed circuit board, not illustrated, together with other electronic components in the tilt unit 20. A wire bundle 22 is electrically connected to the printed circuit board.

The base 30 includes a tilt drive source 32, which drives the tilt unit 20.

A wire bundle 22 is connected to the drive source 32, and runs in a storage area S and electrically is connected to a control circuit board 70.

(Wire Bundle 22)

Figure 3A:
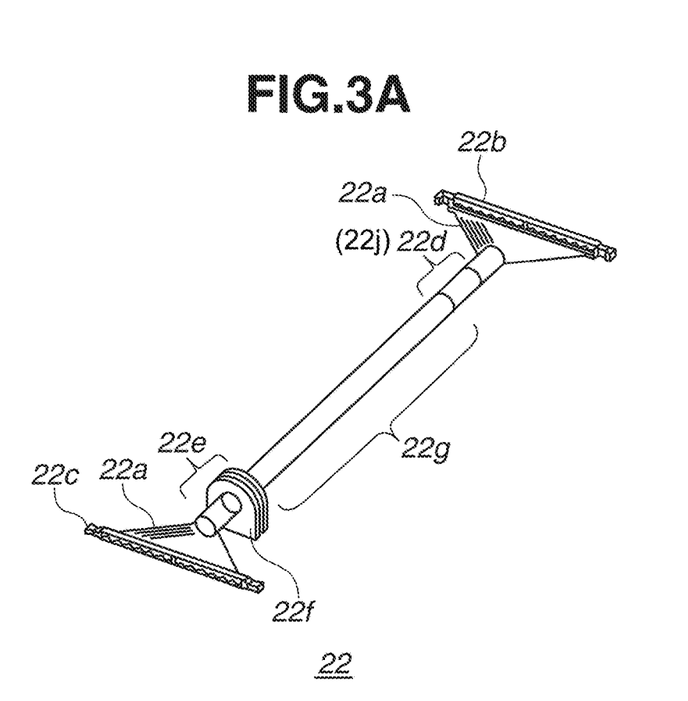
FIGS. 3A to 3C are perspective views of a wire bundle in the exemplary embodiment of the present invention.

The wire bundle 22 includes, as illustrated in FIG. 3A, plural electric wires 22a each composed of a core wire of a conductor coated with an insulator, and connectors 22b and 22c connected to both ends of the electric wires 22a.

The electric wires 22a are bundled with adhesive tape at positions close to the connectors 22b and 22c.

The electric wires 22a in the wire bundle 22 may be coaxial cables each including an inner conductor, an insulator, an external conductor, and a protective coating as appropriate.

The wire bundle 22 extends from the back surface of the tilt unit 20 in which the connector 22b of the wire bundle 22 electrically connected to the printed circuit board via connector 1001, and the connector 22c is electrically connected to the circuit board assembly 70 of the fixed part 1 via connector 1002.

The wire bundle 22 further includes a first fixed part 22d and a second fixed part 22e. The first fixed part 22d is fixed to the back surface of the tilt unit 20, and the second fixed part 22e is fixed to the inside of the fixed part 1.

In the imaging apparatus 100 according to the exemplary embodiment of the present invention, the second fixed part 22e of the wire bundle 22 includes a bush member 22f as an integral part around the outer circumference of the wire bundle 22, and the wire bundle 22 is fixed to the inside of the fixed part 1 with the bush member 22f.

It is suitable that the bush member 22f is integral with the wire bundle 22 by crimping, adhesion, insert molding, or another technique.

The first fixed part 22d of the wire bundle 22 is made of an elastic member such as a cushion. The wire bundle 22 is fixed to the back surface of the tilt unit 20 with the elastic member.

The bush member 22f is a cylindrical or donut-shaped mechanical part fitted into a shaft or a cylindrical member to seal gap or absorb shock.

The area between the first fixed part 22d and the second fixed part 22e is an extra-length part 22g with flexibility.

The extra-length part 22g is bent or twisted in the storage area S containing the extra length, as described below, following panning drive and tilting drive of the movable part 2 with respect to the fixed part 1.

The extra-length part 22g has at least a length enough to follow panning drive and tilting drive of the movable part 2 with respect to the fixed part 1.

The above-mentioned fixing at the two locations, the first fixed part 22d and the second fixed part 22e, is suitable to ensure that the length of the extra-length part 22g is long enough to be sufficiently flexible in the limited extra-length storage area S.

This is because, if a third fixed part is added to the extra-length part 22g, the extra-length part 22g will lose flexibility and have difficulty in smoothly following panning drive and tilting drive.

The extra-length part 22g in bending or twisting may come into light contact with the inner wall or other areas defining the extra-length storage area S.

Furthermore, if the length is long enough to follow panning drive and tilting drive of the movable part 2 with respect to the fixed part 1, another fixed part can be added between the first fixed part 22d and the second fixed part 22e.

This allows the wire bundle 22 to be fixed more firmly without affecting the extra-length part 22g's following panning drive and tilting drive.

(Method of Fixing the Wire Bundle 22 to a Fixation Target with the Bush Member 220

A method of fixing the wire bundle 22 to a fixation target with the bush member 22f will be described with reference to FIGS. 3B and 3C.

Figure 3B:
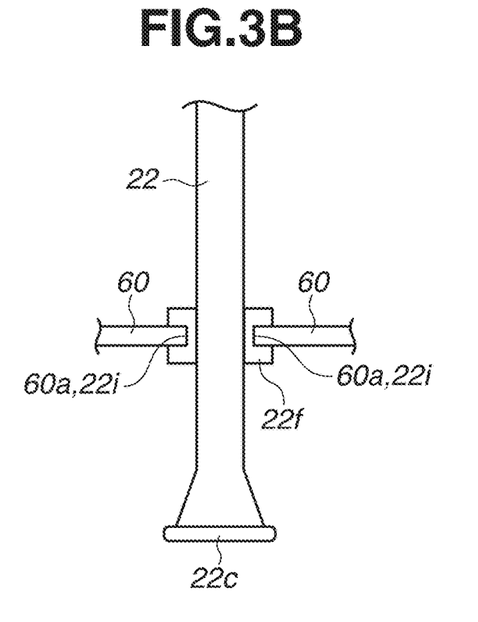
Figure 3C:
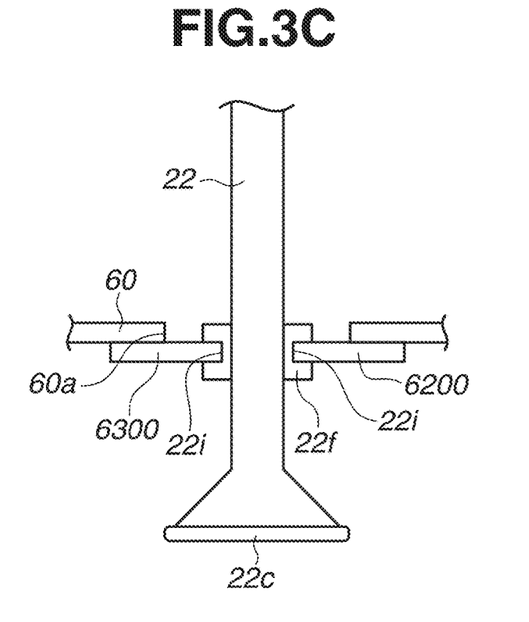

FIGS. 3B and 3C are diagrams illustrating a method of fixing the wire bundle 22 by engaging the bush member 22f with a fixation target.

As illustrated in FIG. 3B, for example, the edge of an opening 60a in a base chassis 601, which will be described below, is fitted into an engagement part 22i in the bush member 22f in a direction orthogonal to the opening 60a.

This allows the wire bundle 22 to be reliably fixed to the fixation target and prevents the wire bundle 22 from easily coming off the fixation target.

The bush member 22f may be press-engaged with the opening 60a. In that case, it is suitable that the bush member 22f is made of an elastic body such as a rubber member.

FIG. 3C illustrates a case of a relatively large connector employed as the connector 22c of the wire bundle 22.

In this case, along with the upsizing of the connector 22c of the wire bundle 22, the opening 60a in the base chassis 601 for passing the connector 22c through becomes larger.

This leads to a larger size of the bush member 22f for the engagement part 22i of the bush member 22f to be engaged with the end of the opening 60a as illustrated in FIG. 3B, deteriorating the workability of passing the wire bundle 22 through the opening 60a.

To tackle this issue, as illustrated in FIG. 3C, other members such as holding members 6200 and 6300 are placed between the bush member 22f of the wire bundle 22 and the base chassis 601 to fix the bush member 22f to the base chassis 601, improving the workability.

Instead of using the method of fixing the wire bundle 22 described above, the bush member 22f may be fixed with a screw or adhesively attached to the fixation target.

The method of fixing the wire bundle 22 described above is applicable for the tilt unit 20.

The tilt unit 20 includes a pair of shaft parts on both side surfaces of the lens barrel unit 21.

The pan unit base 30 includes a pair of bearing parts supporting the shaft parts of the tilt unit 20 along the rotation axis T.

Fitting each shaft part to the corresponding bearing part allows the tilt unit 20 to be held rotatably with respect to the pan unit base 30.

The pan unit base 30 includes a hollow rotation shaft 30a extending in the thrust direction of the rotation axis P.

The base cover 50 has a cylindrical part 50a extending in the thrust direction of the rotation axis P.

Fitting the hollow rotation shaft 30a into the cylindrical part 50a allows the pan unit base 30 to be rotatable with respect to the base cover 50.

The pan unit base 30 is mounted on the base cover 50 with the base cover 50 fitted between the pan unit base 30 and a pan unit rotation plate 40, and is held rotatably around the rotation axis P.

The pan unit base 30 further includes a flexible circuit board 31 and a tilting drive unit 32 electrically connected to the flexible circuit board 31.

The flexible circuit board 31 is electrically connected to the circuit board assembly 70 in the fixed part 1 and behaves to follow panning drive of the pan unit base 30 with respect to the fixed part 1.

Upon an input of a drive signal from the circuit board assembly 70, the tilting drive unit 32 produces a driving force to cause the tilt unit 20 to perform tilting drive.

The chassis unit 60 includes the base chassis 601 and plural metal supports.

The base chassis 601 is made of a material such as aluminum or stainless steel (SUS) and is formed by presswork or drawing into an intended shape.

The metal supports are made of an SUS material or a brass material (BS material), and is jointly fixed to the base chassis 601.

The supports are tapped for screw tightening. The chassis unit 60 is fixed to the base cover 50 with screws, not illustrated.

The chassis unit 60 further includes a panning drive unit 610. The panning drive unit 610 includes a flexible circuit board with one end of the flexible circuit board electrically connected and fixed to the circuit board assembly 70.

Upon an input of a drive signal from the circuit board assembly 70, the panning drive unit 610 produces a driving force to cause the pan unit rotation plate 40 to perform panning drive.

The circuit board assembly 70 is fixed in contact with the metal supports of the chassis unit 60 with screws.

The base chassis 601 of the chassis unit 60 has the opening 60a in a substantially circular shape in the center.

The wire bundle 22 and the flexible circuit board 31 run through the opening 60a to the circuit board assembly 70.

The bottom unit 80 includes a battery for operating the imaging apparatus 100 and operation buttons that can be pressed externally.

The fixed part 1 is assembled by securing the bottom unit 80 to the base cover 50 with screws, not illustrated, completing the assembling of the imaging apparatus illustrated in FIG. 1.

Figure 7:
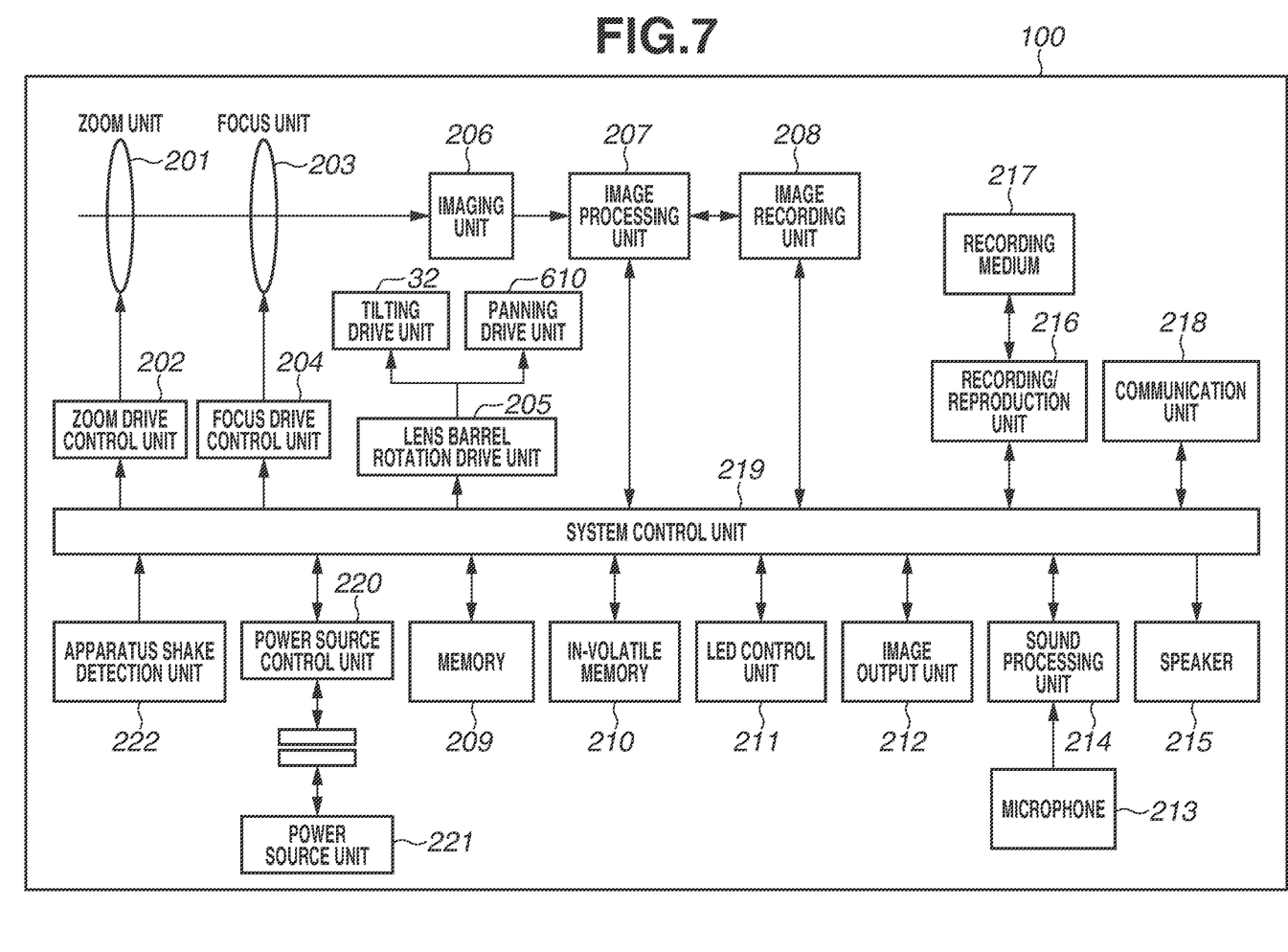
FIG. 7 is a block diagram of image capturing functions of the present invention.

(Description of the Block Diagram in FIG. 7)

FIG. 7 is a block diagram illustrating a configuration example of the imaging apparatus 100 as an example of the imaging apparatus in the present invention.

Referring to FIG. 7, a system control unit 219 includes a processor (for example, a central processing unit (CPU), a graphics processing unit (GPU), a microprocessor, or a micro processing unit (MPU)) and a memory (for example, a dynamic random-access memory (DRAM) or a static RAM (SRAM)).

They execute various types of processing to control each of the blocks of the imaging apparatus 100.

A non-volatile memory (electrically erasable programmable read-only memory (EEPROM)) 210 is an electrically erasable/recordable memory that stores constants and programs for operating the control unit.

Referring to FIG. 7, a zoom unit 201 includes a zoom lens that serves to perform magnification. A zoom drive control unit 202 performs the drive control of the zoom unit 201.

A focus unit 203 includes a lens that serves to adjust focus. A focus drive control unit 204 performs drive control of the focus unit 203.

In an imaging unit 206, an imaging device such as a CCD or a CMOS converts optical images input through an optical system into electric signals, and outputs information about electric charges based on the quantity of incident light as analog image data to an image processing unit 207.

The image processing unit 207 performs image processing on the digital image data output through A/D conversion, such as skew correction, white balance adjustment, and color interpolation, and outputs the digital image data having undergone the image processing.

An image recording unit 208 converts the digital image data output from the image processing unit 207 into data in a recording format such as Joint Photographic Experts Group (JPEG) format, and transmits the data to a memory 209 and an image output unit 212.

A lens barrel rotation drive unit 205 causes the tilting drive unit 32 and the panning drive unit 610 to drive the lens barrel in the tilt direction and the pan direction.

An apparatus shake detection unit 222 includes an angular velocity meter (gyro sensor) that detects the triaxial angular velocity of the imaging apparatus 100 and an accelerometer (accelerator sensor) that detects the triaxial acceleration of the apparatus.

The apparatus shake detection unit 222 calculates the rotation angle and shift amount of the apparatus based on the detected signal.

A microphone (sound input unit) 213 acquires sound signals around the imaging apparatus. The sound signals undergo A/D conversion through an amplifier or another component, and the microphone 213 transmits the converted signals to a sound processing unit 214.

The sound processing unit 214 performs sound-related processing such as making the input digital sound signals appropriate.

Then, the system control unit 219 transmits the sound signals processed by the sound processing unit 214 to the memory 209.

The memory 209 temporarily stores image signals and sound signals from the image processing unit 207 and the sound processing unit 214.

The image processing unit 207 and the sound processing unit 214 read the image signals and sound signals temporarily stored in the memory 209, and encodes them to generate compressed image signals and compressed sound signals.

A system control unit 219 transmits these compressed image signals and compressed sound signals to a recording/reproduction unit 216.

The recording/reproduction unit 216 records the compressed image signals and compressed sound signals, and other image capturing-related control data on a recording medium 217.

The recording medium 217 may be a recording medium included in the imaging apparatus 100 or a recording medium detachably attached to the imaging apparatus 100.

The recording medium 217 can record various kinds of data such as compressed image signals, compressed sound signals, and sound signals generated by the imaging apparatus 100, and typically has a larger capacity than the non-volatile memory 210.

Example of the recording medium 217 include a recording medium in any type such as hard disc, optical disc, magneto-optical disc, compact disc-recordable (CD-R), digital versatile disc-recordable (DVD-R), magnetic tape, non-volatile semiconductor memory, and flash memory.

The recording/reproduction unit 216 reads (and reproduces) compressed image signals, compressed sound signals, sound signals, various kinds of data, and programs from the recording medium 217.

The recording/reproduction unit 216 then transmits the read compressed image signals and compressed sound signals to the image processing unit 207 and the sound processing unit 214.

The image processing unit 207 and the sound processing unit 214 temporarily stores the compressed image signals and compressed sound signals in the memory 209, decodes these signals according to a predetermined procedure, and transmits the decoded signals to the image output unit 212 and the speaker (sound output unit) 215.

The speaker (sound output unit) 215 outputs a sound pattern preset at the time of image capturing or other opportunities.

A light emitting device (LED) control unit 211 controls LEDs in the imaging apparatus 100 in a lighting/blinking pattern preset at the time of image capturing or other opportunities.

The image output unit 212 includes an image output terminal, for example, and transmits image signals for image display to an externally connected display device or other devices.

A communication unit 218 allows communication between the imaging apparatus 100 and an external apparatus, and transmits and receives data such as sound signals, image signals, compressed sound signals, and compressed image signals.

The communication unit 218 receives image capturing-related control signals for a shooting start command, a shooting end command, and panning/tilting, and zoom driving, by way of example, and drives the imaging apparatus 100 following an instruction issued from an external device communicable with the imaging apparatus 100.

The communication unit 218 is a wireless communication module such as an infrared communication module, a Bluetooth® communication module, a wireless LAN communication module, or a GPS receiver.

A power source control unit 220 includes a battery detection circuit, a direct current-direct current (DC-DC) converter, and a switch circuit switching a block to be energized, and detects the presence or absence of an attached battery, the type of the battery, and the remaining capacity of the battery.

The power source control unit 220 also controls the DC-DC converter based on detection results and instructions from the system control unit, and supplies appropriate voltages to the components including the recording medium 217 for appropriate periods of time.

A power source unit 221 includes a primary battery such as an alkali or lithium battery, a secondary battery such as a NiCd battery, a NiMH battery, or a Li battery, or an AC adapter.

The power source unit 221 and the power source control unit 220 are connected to each other via a power source connector on the camera and a power source connector.

(Cross-Sectional View of Wiring and Main Components in the Imaging Apparatus 100)

Figure 4:
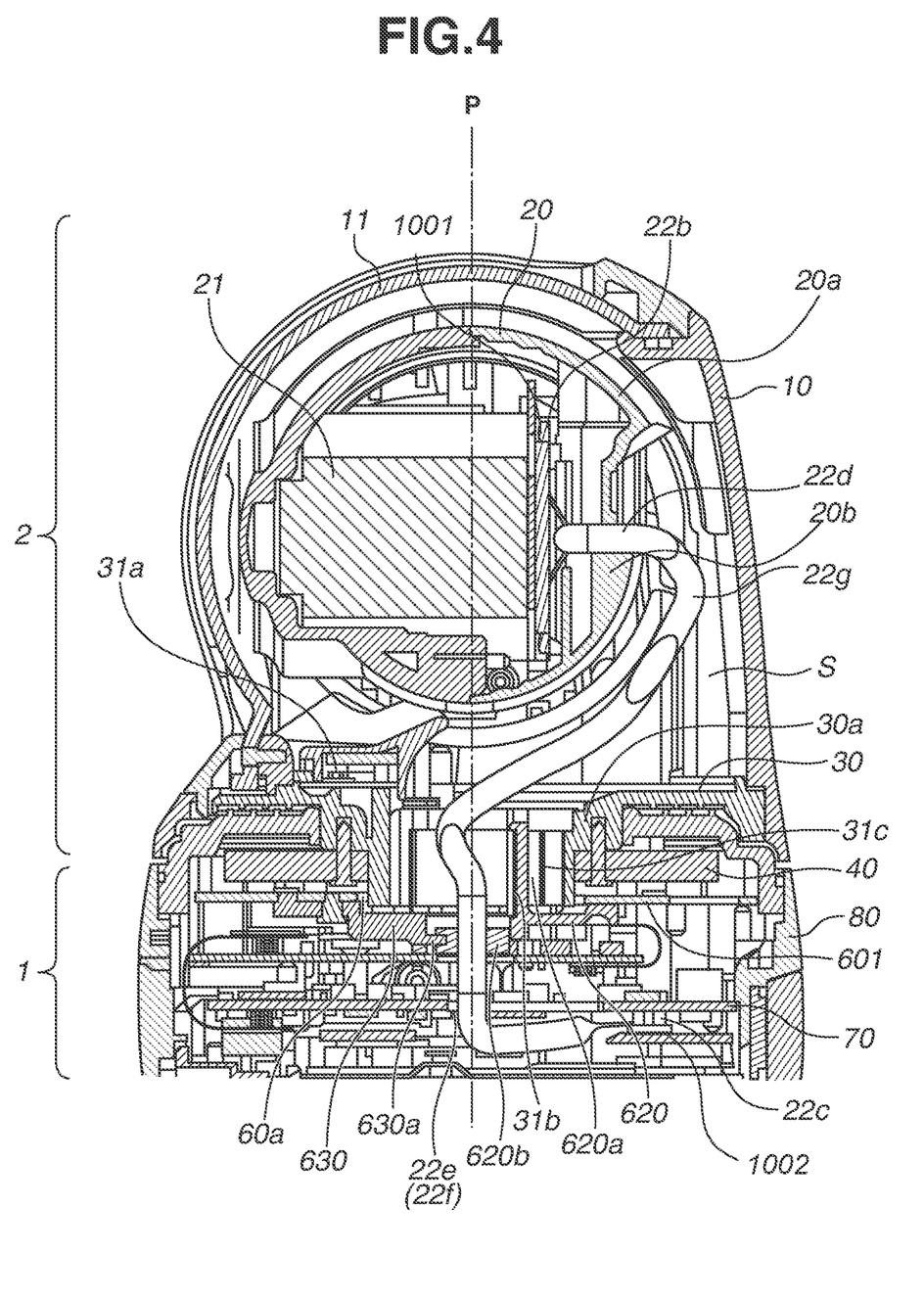
FIG. 4 is a cross-sectional view of main components of the imaging apparatus in the exemplary embodiment of the present invention.

FIG. 4 is a cross-sectional view of main components in the imaging apparatus 100 as an electronic apparatus for a description of wiring.

The imaging apparatus 100 includes the movable cylinder 2 and the support cylinder 1, which supports the movable cylinder 2 rotatably around the panning rotation axis P.

The imaging apparatus 100 also includes the wire bundle 22, which connects the panning control circuit board 70 in the support cylinder, and a storage area S. The storage area S is in the movable cylinder 2, communicates with the support cylinder 1, and contains the wire bundle 22.

For a simple description, the cross-sectional view illustrates the first fixed part 22d of the wire bundle 22 as a main part in the tilt unit 20 and its vicinity, and the rotation axis P and its vicinity of the fixed part 1.

The wire bundle 22 and the flexible circuit board 31 run inside the hollow rotation shaft 30a in the pan unit base 30 extending in the thrust direction of the rotation axis P and through the opening 60a in the center of the base chassis 601, and are connected to the circuit board assembly 70.

The first fixed part 22d of the wire bundle 22 is fixed to the back surface of the tilt unit 20, and the second fixed part 22e is fixed to the base chassis 601 in the fixed part 1.

Thus, the extra-length part 22g of the wire bundle 22 is contained in the extra-length storage area S between the first fixed part 22d and the second fixed part 22e.

In the extra-length storage area S, the extra-length part 22g of the wire bundle 22 behaves to follow the panning drive and tilting drive of the movable part 2 with respect to the fixed part 1.

During the panning drive and tilting driving, the second fixed part 22e is likely to be put under a load due to bending and twisting of the extra-length part 22g.

As above mentioned, the fixing via the bush member 22f, which is integral with the wire bundle 22, prevents the fixed part from shifting.

On the other hand, the first fixed part 22d is put under a load mainly due to bending of the extra-length part 22g during the tilting drive, and is less likely to be put under a load due to twisting of the extra-length part 22g.

Thus, a relatively rough fixing method may be applied to the first fixed part 22d compared with a method applied to the second fixed part 22e.

The imaging apparatus 100 of the present exemplary embodiment uses the elastic member such as a cushion for the first fixed part 22d.

The wire bundle 22 is fixed by the elastic member being nipped between an upper cover 20a and a lower cover 20b included in the tilt unit 20.

The elastic member j for the first fixed part 22d prevents the fixed part from shifting in a more reliable manner and reduces the stress on the wire bundle 22 with the elastic member nipped between the upper cover 20a and the lower cover 20b.

On the other hand, the flexible circuit board 31 is wound around the wire bundle 22 plural times in the extra-length storage area S, and is connected to the circuit board assembly 70.

The flexible circuit board 31 has one end 31a adhesively fixed to the pan unit base 30 with double-sided adhesive tape, not illustrated, and the other end 31b adhesively fixed to a standing wall part 620a on a first holding member 620, which will be described below, with double-sided adhesive tape, not illustrated.

This allows a wounded part 31c of the flexible circuit board 31 to be contained at a predetermined position in the extra-length storage area S together with the extra-length part 22g of the wire bundle 22.

The wounded part 31c gets loose or tight in the extra-length storage area S with panning drive of the movable part 2 with respect to the fixed part 1.

In the present exemplary embodiment, the first fixed part 22d of the wire bundle 22 is in the movable cylinder 2 and the second fixed part 22e is in the support cylinder 1.

In the storage area S, the first fixed part 22d is fixed to a first fixing part of the movable cylinder 2.

In the storage area, the second fixed part 22e is fixed to a second fixing part of the support cylinder 1.

The second fixed part 22e is fixed alongside the panning rotation axis P of the movable cylinder 2 in the storage area S of the support cylinder 1, not alongside the panning rotation axis P of the movable cylinder 2 in the storage area S of the movable cylinder 2.

The second fixed part 22e is the bush member 22f as an integral part around the outer circumference of the wire bundle 22.

The movable cylinder 2 includes the base 30 supported on the support cylinder 1 rotatably around the panning rotation axis P, and the tilt unit 20 supported on the base 30 rotatably around a tilt rotation axis T extending in a direction different from the panning rotation axis P.

The wire bundle 22 runs from the tilt unit 20.

The first fixed part 22d is the elastic member on the outer circumference of the wire bundle 22.

The elastic member is nipped in the tilt unit 20.

The first fixed part 22d is fixed to the tilt unit 20 at a position away from the panning rotation axis P of the base 30 by a predetermined distance L in the direction parallel to the tilt rotation axis T of the tilt unit 20.

In the storage area S of the movable cylinder 2, the wire bundle 22 is slack in the direction opposite to the direction in which the wire bundle 22 runs from the tilt unit 20.

The support cylinder 1 includes the first holding member 620, which holds the wire bundle 22, and a second holding member 630, which fixes the bush member 22f together with the first holding member 620.

The bush member 22f includes the engagement part 22i in the direction orthogonal to the wire length direction of the wire bundle 22 and a contact part 22h at a position closer to the end of the wire bundle 22 than the engagement part 22i.

Between the base 30 and the control circuit board 70, the engagement part 22i is fitted into an engagement part 630a on the second holding member 630, and the contact part 22h is in contact with a contact part 620b on the first holding member 620.

(Method of Fixing the Wire Bundle 22 and Method of Fixing the Flexible Circuit Board 31 in the Fixed Part 1)

Next, a method of fixing the wire bundle 22 and a method of fixing the flexible circuit board 31 in the fixed part 1 will be specifically described with reference to FIG. 5.

Figure 5:
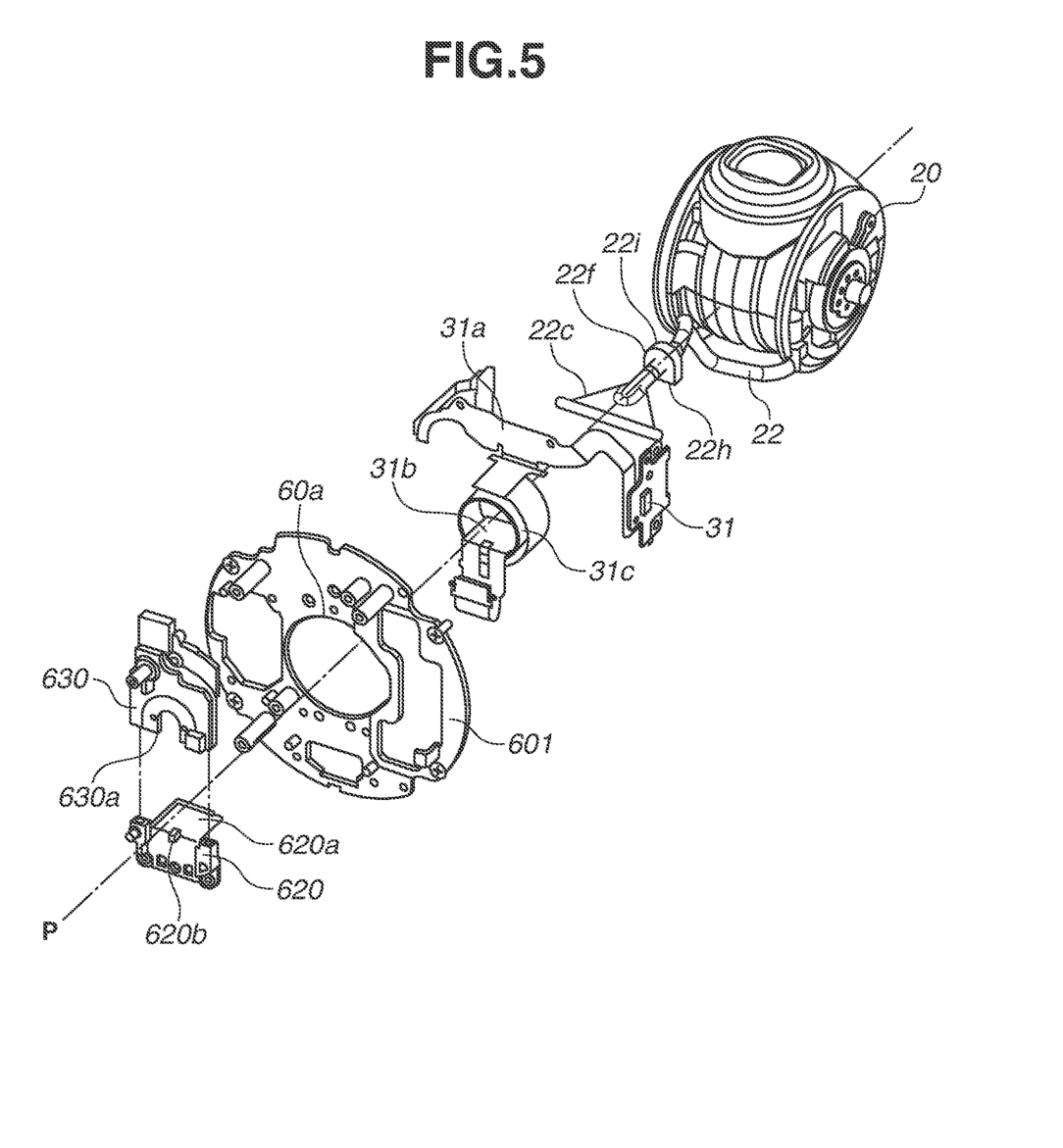
FIG. 5 is a perspective view of a detailed configuration of the wire bundle and components at the part to fix a flexible circuit board and its neighboring area in the exemplary embodiment of the present invention.

FIG. 5 is an exploded perspective view of a detailed configuration of components for fixing the wire bundle 22 and the flexible circuit board 31 in the fixed part 1.

The first holding member 620 and the second holding member 630 are under the extra-length storage area S.

The first holding member 620 includes the standing wall part 620a protruding toward the tilt unit 20 along the rotation axis P, and the other end 31b of the flexible circuit board 31 is adhesively fixed to the standing wall part 620a.

The first holding member 620 is attached to the base chassis 601 with the standing wall part 620a protruding in the extra-length storage area S.

Thus, the wounded part 31c of the flexible circuit board 31 is contained at a predetermined position in the extra-length storage area S.

The second holding member 630 includes the engagement part 630a in a direction substantially orthogonal to the rotation axis P, and the engagement part 22i of the bush member 22f as an integral part around the outer circumference of the wire bundle 22 is fitted to the engagement part 630a.

The second holding member 630 with the wire bundle 22 held thereto is positioned by the first holding member 620.

Simultaneously, the second holding member 630 is attached to the base chassis 601 with the contact part 22h of the bush member 22f left in contact with the contact part 620b of the first holding member 620.

Thus, the wire bundle 22 is held along the rotation axis P with the extra-length part 22g of the wire bundle 22 contained in the extra-length storage area S.

As the bush member 22f engaged with the second holding member 630 is in contact with the first holding member 620, the wire bundle 22 will not be rotated as the wire bundle 22 is twisted in the extra-length storage area S.

The wire bundle 22 is fixed to the fixed part 1 via the bush member 22f as an integral part in the above mentioned configuration, preventing the wire bundle 22 from easily coming off.

In other words, the extra-length part 22g of the wire bundle 22 is being bent or twisted in the extra-length storage area S, following panning drive and tilting drive of the movable part 2 while keeping a length.

While the extra-length part 22g of the wire bundle 22 is being bent or twisted in the extra-length storage area S, the wire bundle 22 is kept in place, preventing the circuit board from being put under a load due to the behavior.

The positioning of the bush member 22f by the first holding member 620 holding the flexible circuit board 31 through the adhesively fixing process makes it easy to control the positional relationship between the wire bundle 22 and the flexible circuit board 31.

Thus, this configuration makes it easy to make position settings of the wire bundle 22 and the flexible circuit board 31 to prevent both in motion from coming in contact with each other, preventing a break in the wire bundle or other damage due to contact with each other.

During panning drive of the movable part 2, the wire bundle 22 is twisted around the rotation axis P without being warping. This achieves a far smaller area occupied by the wire bundle 22 in the imaging apparatus 100.

In other words, this reduces the extra-length storage area S, leading to a miniaturization of the imaging apparatus 100.

In the exemplary embodiment of the present invention, the wire bundle 22 and the flexible circuit board 31 run in the extra-length storage area S including the inside of the hollow rotation shaft 30a of the pan unit base 30 and are connected to the circuit board assembly 70.

This eliminates the need for drawing the wire bundle 22 and the flexible circuit board 31 out from the lateral side of the pan unit base 30.

This achieves a far smaller space occupied by the wire bundle 22 and the flexible circuit board 31 being warp following the movable part 2.

In other words, as compared with the case where the wire bundle 22 and the flexible circuit board 31 are drawn out from the lateral side of the pan unit base 30, the imaging apparatus 100 can be downsized as seen along the axis P.

On the other hand, as the extra-length storage area S is reduced with the downsizing of the imaging apparatus 100, the length of the extra-length part 22g of the wire bundle 22 containable in the extra-length storage area S becomes smaller.

According to the exemplary embodiment of the present invention, together with efficient use of the extra-length storage area S, the extra-length part 22g of the wire bundle 22 has a length enough to follow panning drive and tilting drive of the movable part 2 with respect to the fixed part 1.

(Top View of the Imaging Apparatus 100)

Figure 6:
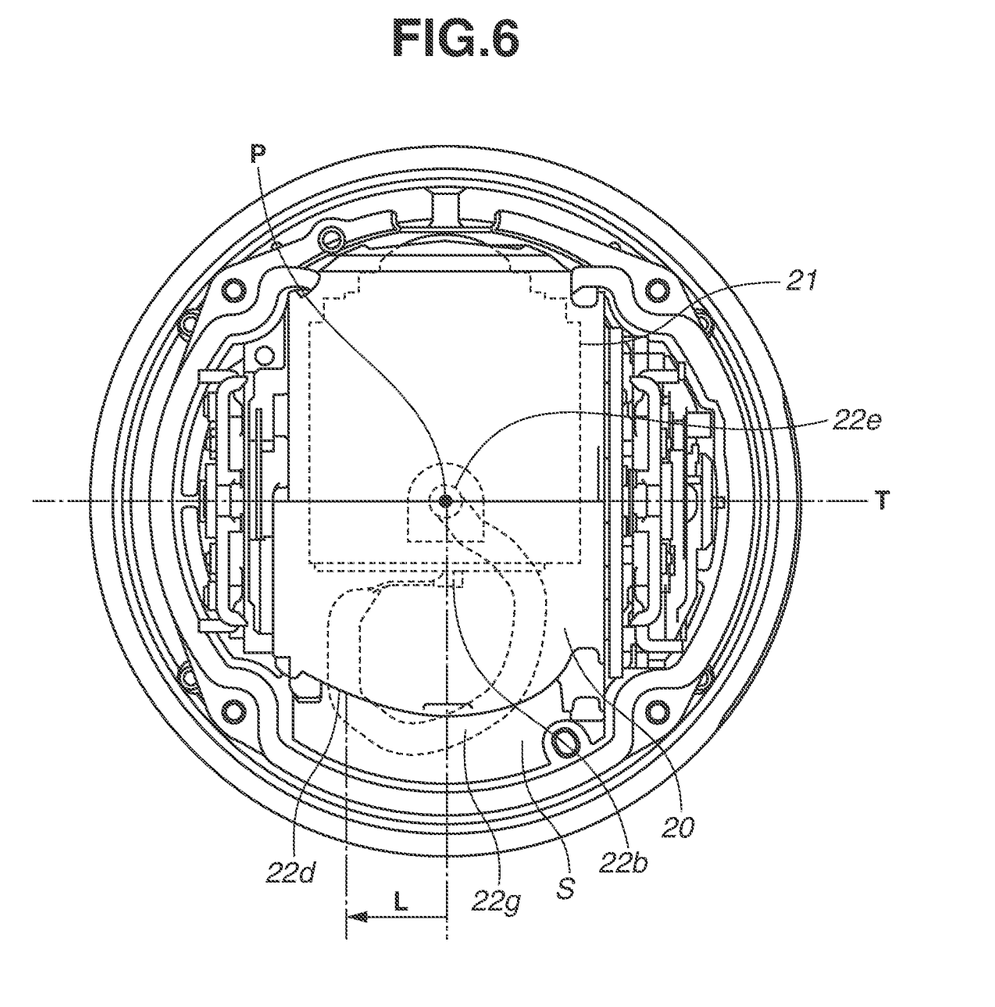
FIG. 6 is a top view of the imaging apparatus in the exemplary embodiment of the present invention.

FIG. 6 is a top view of the imaging apparatus 100 in the exemplary embodiment of the present invention. In FIG. 6, the top cover 10 is not illustrated, and the lens barrel unit 21 and the wire bundle 22 are illustrated by dotted lines for the convenience of description.

The first fixed part 22d of the wire bundle 22 connected to the lens barrel unit 21 with the connector 22b is fixed to and held on the back surface of the tilt unit 20 at a position away from the rotation axis P by a predetermined distance L in the direction parallel to the rotation axis T.

The extra-length part 22g of the wire bundle 22 is contained in the extra-length area S in the direction parallel to the rotation axis T to get warped in the direction opposite to L, and is fixed and held along the rotation axis P.

This ensures a length of the extra-length part 22g of the wire bundle 22 enough to follow panning drive and tilting drive of the movable part 2 with respect to the fixed part 1.

The shapes of the support cylinder 1 (fixed part) and movable cylinder 2 (movable part) of the present invention are not limited to circular columnar shapes and may be rectangular (for example, cuboid).

The exemplary embodiments and application examples of the present invention have been described above. However, the present invention is not limited to these exemplary embodiments and can be modified and changed without departing from the gist of the present invention.

According to the present invention, a compact rotation drive device can be provided that has a wiring configuration reducing the stress on a wire and the connections of the wire.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-161439, filed Sep. 25, 2020, which is hereby incorporated by reference herein in its entirety.

What is claimed is:

1. An imaging apparatus comprising:
   a movable cylinder configured to support a lens barrel;
   a support cylinder configured to support the movable cylinder rotatably around a panning rotation axis;
   a flexible wire connecting to a panning control circuit board in the support cylinder; and
   a storage area communicating with the movable cylinder and the support cylinder and containing the flexible wire,
   wherein the flexible wire includes a first connector connected to the movable cylinder and a first fixed part fixed to the movable cylinder, and a second connector connected to the support cylinder and a second fixed part fixed to the support cylinder;
   wherein the first connector and the first fixed part are separated,
   wherein the second connector and the second fixed part are separated,
   wherein, in the storage area, the first fixed part is made of a cushion and is mechanically fixed to the movable cylinder,
   wherein, in the storage area, the second fixed part includes a bush member and is mechanically fixed to the support cylinder via the bush member, which is integral with the flexible wire,
   wherein, in the movable cylinder, the first connector is electrically connected to a connector of the movable cylinder,
   wherein, in the support cylinder, the second connector is electrically connected to a connector of the support cylinder, and
   wherein the second fixed part is fixed along the panning rotation axis of the movable cylinder in the storage area of the support cylinder, and the first fixed part is fixed not along the panning rotation axis of the movable cylinder in the storage area of the movable cylinder.

2. The imaging apparatus according to claim 1, wherein the bush member is an integral part around an outer circumference of the flexible wire.

3. The imaging apparatus according to claim 2, wherein the support cylinder includes a first holding member holding the flexible wire and a second holding member fixing the bush member in cooperation with the first holding member.

4. The imaging apparatus according to claim 3,
   wherein the bush member includes an engagement part in a direction orthogonal to a wiring direction of the flexible wire and a contact part at a position closer to an end of the flexible wire than the engagement part, and
   wherein, between the base and the panning control circuit board, the engagement part is engaged with an engagement part of the second holding member and the contact part is in contact with a contact part in the first holding member.

5. The imaging apparatus according to claim 1,
   wherein the movable cylinder includes a base supported on the support cylinder rotatably around the panning rotation axis and a driven body supported on the base rotatably around a tilt rotation axis extending in a direction different from the panning rotation axis, and
   wherein the flexible wire runs from the driven body.

6. The imaging apparatus according to claim 5,
   wherein the cushion is on an outer circumference of the flexible wire, and
   wherein the cushion is nipped in the driven body.

7. The imaging apparatus according to claim 5,
   wherein the first fixed part is fixed to the driven body at a position away from the panning rotation axis of the base by a predetermined distance in a direction parallel to the tilt rotation axis of the driven body, and wherein the flexible wire is slack in the storage area of the movable cylinder in a direction opposite to the direction in which the flexible wire runs from the driven body.

8. The imaging apparatus according to claim 5,
wherein the base includes a tilt drive source configured to drive the driven body, and
wherein the flexible wire connected to the drive source runs in the storage area and electrically connects to the panning control circuit board.

* * * * *